United States Patent
Vlaiko

(10) Patent No.: US 8,458,572 B1
(45) Date of Patent: Jun. 4, 2013

(54) EFFICIENT STORAGE OF ERROR CORRECTION INFORMATION IN DRAM

(75) Inventor: Julian Vlaiko, Kfar Saba (IL)

(73) Assignee: Apple Inc., Cupertino, CA (US)

( * ) Notice: Subject to any disclaimer, the term of this patent is extended or adjusted under 35 U.S.C. 154(b) by 341 days.

(21) Appl. No.: 12/876,170

(22) Filed: Sep. 6, 2010

Related U.S. Application Data

(60) Provisional application No. 61/263,859, filed on Nov. 24, 2009.

(51) Int. Cl.
*H03M 13/00* (2006.01)
(52) U.S. Cl.
USPC .............................. 714/776; 360/48; 711/103
(58) Field of Classification Search
USPC .............................. 714/776; 711/103; 360/48
See application file for complete search history.

(56) References Cited

U.S. PATENT DOCUMENTS

| | | | |
|---|---|---|---|
| 5,134,616 A | 7/1992 | Barth, Jr. et al. | |
| 7,447,950 B2 | 11/2008 | Takahashi et al. | |
| 7,599,235 B2 | 10/2009 | Thayer | |
| 2006/0101193 A1* | 5/2006 | Murin | 711/103 |
| 2007/0113155 A1* | 5/2007 | Takahashi | 714/763 |
| 2009/0002864 A1* | 1/2009 | Duelk et al. | 360/48 |
| 2009/0251988 A1 | 10/2009 | Kim et al. | |

* cited by examiner

*Primary Examiner* — Sam Rizk
(74) *Attorney, Agent, or Firm* — Meyertons, Hood, Kivlin, Kowert & Goetzel, P.C.

(57) ABSTRACT

A method for data storage includes encoding input data with an Error Correction Code (ECC), to produce encoded data. The encoded data is formatted in a super-frame consisting of a given number of burst sequences arranged in parallel, each burst sequence consisting of one or more bursts of multiple bytes of the encoded data. The burst sequences of the super-frame are stored in respective memory devices over a single data bus having a bus width, in bytes, that is equal to the given number.

21 Claims, 2 Drawing Sheets

US 8,458,572 B1

EFFICIENT STORAGE OF ERROR CORRECTION INFORMATION IN DRAM

CROSS-REFERENCE TO RELATED APPLICATIONS

This application claims the benefit of U.S. Provisional Patent Application 61/263,859, filed Nov. 24, 2009, whose disclosure is incorporated herein by reference.

FIELD OF THE INVENTION

The present invention relates generally to data storage, and particularly to methods and systems for storing error correction information in memory devices.

BACKGROUND OF THE INVENTION

Memory systems often use Error Correction Coding (ECC) in order to increase data storage reliability and reduce the likelihood of read errors. For example, U.S. Pat. No. 7,599,235, whose disclosure is incorporated herein by reference, describes an error correction system and method operable to identify and correct a memory module disposed within a computer memory system. In one embodiment, the memory system comprises a first memory module and a second memory module, each comprising a plurality of memory devices; and a memory controller operably coupled to the first memory module and the second memory module. The memory controller is operable to use an ECC word, comprising data and redundant data, to detect module-level errors in the first and second memory modules.

U.S. Pat. No. 5,134,616, whose disclosure is incorporated herein by reference, describes a Dynamic Random Access Memory (DRAM) having on-chip ECC and both bit and word redundancy that have been optimized to support the on-chip ECC. The bit line redundancy features a switching network that provides any-for-any substitution for the bit lines in the associated memory array. The word line redundancy is provided in a separate array section, and has been optimized to maximize signal while reducing soft errors.

U.S. Pat. No. 7,447,950, whose disclosure is incorporated herein by reference, describes a memory system in which an ECC circuit is not inserted on a data path for data writing/reading. The ECC process is performed during the cycle of normal data reading/writing process, in such timing that it does not conflict with the data reading/writing process in order not to cause a substantial delay in the data writing/reading process.

U.S. Patent Application Publication 2009/0251988, whose disclosure is incorporated herein by reference, describes a memory system, memory interface device and method for a non-power-of-two burst length. The memory system includes a plurality of memory devices with non-power-of-two burst length logic and a memory interface device including non-power-of-two burst length generation logic. The non-power-of-two burst length generation logic extends a burst length from a power-of-two value to insert an error-detecting code in a burst on data lines between the memory interface device and the plurality of memory devices.

SUMMARY OF THE INVENTION

An embodiment of the present invention that is described herein provides a method for data storage, including:
  encoding input data with an Error Correction Code (ECC), to produce encoded data;
  formatting the encoded data in a super-frame consisting of a given number of burst sequences arranged in parallel, each burst sequence consisting of one or more bursts of multiple bytes of the encoded data; and
  storing the burst sequences of the super-frame in respective memory devices over a single data bus having a bus width, in bytes, that is equal to the given number.

In some embodiments, the given number is not an integer power of two. In an embodiment, the given number is three, and the bus width is three bytes. In a disclosed embodiment, the encoded data includes data bits and redundancy bits, and formatting the encoded data includes interleaving the data bits and the redundancy bits in the super-frame. In another embodiment, formatting the encoded data includes filling all the bytes in the super-frame with the encoded data. In some embodiments, the memory devices include Dynamic Random Access Memory (DRAM) devices.

In a disclosed embodiment, the method includes accepting the input data in blocks, and formatting the encoded data includes translating each block of the input data into a respective super-frame. In another embodiment, storing the burst sequences over the single data bus includes assigning respective different portions of the bus width to the memory devices, and storing the burst sequences in the respective memory devices over the respective portions of the bus width. In yet another embodiment, the method includes, after storing the burst sequences, retrieving the input data by reading the super-frame from the memory devices and decoding the ECC that encodes the read super-frame. In still another embodiment, the method includes, after storing the burst sequences, modifying a portion of the super-frame by reading at least part of the super-frame containing the portion from the memory devices, modifying the portion in the read at least part of the super-frame, re-encoding the read at least part of the super-frame, and storing the re-encoded at least part of the super-frame in the memory devices.

There is additionally provided, in accordance with an embodiment of the present invention, a memory controller, including:
  an error correction unit, which is configured to encode input data with an Error Correction Code (ECC) so as to produce encoded data; and
  a storage unit, which is configured to format the encoded data in a super-frame consisting of a given number of burst sequences arranged in parallel, each burst sequence consisting of one or more bursts of multiple bytes of the encoded data, and to store the burst sequences in respective memory devices over a single data bus having a bus width, in bytes, that is equal to the given number.

There is also provided, in accordance with an embodiment of the present invention, a memory system, including:
  a given number of memory devices;
  a data bus having a bus width, in bytes, that is equal to the given number; and
  a memory controller, which is configured to encode input data with an Error Correction Code (ECC) so as to produce encoded data, to format the encoded data in a super-frame consisting of the given number of burst sequences arranged in parallel, each burst sequence consisting of one or more bursts of multiple bytes, and to store the burst sequences in the respective memory devices over the data bus.

The present invention will be more fully understood from the following detailed description of the embodiments thereof, taken together with the drawings in which:

DETAILED DESCRIPTION OF EMBODIMENTS

Overview

Figure 1:
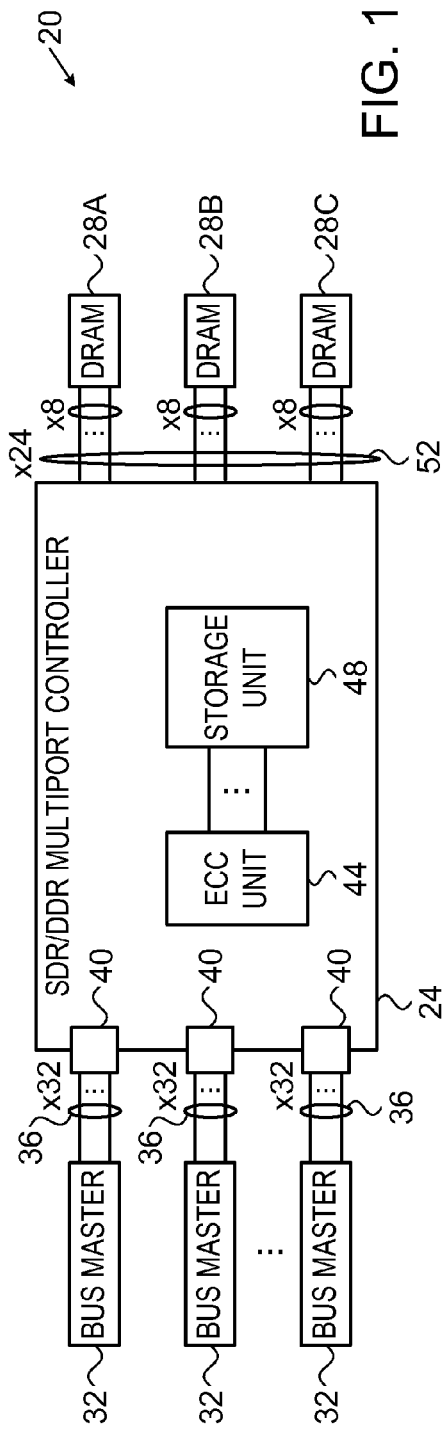
FIG. 1 is a block diagram that schematically illustrates a memory system, in accordance with an embodiment of the present invention.

Embodiments of the present invention that are described hereinbelow provide improved methods and systems for storing data and error correction information in memory devices. Although the embodiments described herein are mainly concerned with Dynamic Random Access Memory (DRAM), the disclosed techniques can be used with various other types of memory.

In some embodiments of the present invention, a memory system comprises a memory controller that stores input data in a given number of memory devices. In order to increase storage reliability, the memory controller encodes the input data with an Error Correction Code (ECC) prior to storing it in the memory devices. The encoding process produces encoded data, in which input data and ECC redundancy information are interleaved.

The memory devices used in the disclosed configurations are designed to accept data for storage in multiple-byte bursts. Each burst comprises M bytes of data that are stored in the device in M consecutive clock cycles. In order to store the encoded data efficiently, the memory controller formats the encoded data in a super-frame. The super-frame comprises multiple sequences of bursts arranged in parallel, with one burst sequence corresponding to each memory device. The memory device stores the super-frame in the memory devices in parallel over a single data bus. The width of the data bus, in bytes, is equal to the number of memory devices.

Typically, the number of memory devices in the system is not an integer power of two. In a typical embodiment, the system comprises three memory devices. Each memory device comprises a DRAM chip that accepts data for storage in bursts of eight-bytes over an 8-bit data bus. The memory controller is connected to the three memory devices over a single 24-bit data bus. In this embodiment, the memory controller accepts a block of input data comprising sixty-four bytes, and encodes them with an ECC that adds a redundancy byte for every eight bytes of data. The block of input data is thus encoded to produce seventy-two bytes of encoded data. The memory controller formats the encoded data in a super-frame of three parallel burst sequences, each burst sequence comprising three eight-byte bursts. The memory controller stores the three burst sequences in parallel in the three memory devices over the 24-bit data bus. The size of the super-frame is typically selected to match the format of the blocks of input data that are provided to the memory controller. In an example embodiment, the input data is provided using a burst size of sixteen beats over a 32-bit or 64-bit bus width, and the super-frame is dimensioned accordingly.

Typically, the ECC code rate, the number of memory devices and the burst size are selected such that a given block of input data is translated into a super-frame that is fully populated with encoded data. As a result, programming of the memory devices is highly efficient and does not waste clock cycles.

In the disclosed configurations, the input data and the ECC redundancy are interleaved with one another and stored together in the memory devices, rather than storing the ECC redundancy separately in parallel with the input data. As a result, the number of Input/Output (I/O) pins of the memory controller can be reduced considerably. Moreover, no additional memory devices need to be dedicated for storing of ECC redundancy. In a typical embodiment, the system comprises standard DRAM chips using their standard interfaces, irrespective of the fact that the stored data comprises interleaved input data and ECC redundancy.

System Description

FIG. 1 is a block diagram that schematically illustrates a memory system 20, in accordance with an embodiment of the present invention. System 20 comprises a memory controller 24, which stores data in three memory devices 28A . . . 28C. In the present example, the memory devices comprise Single Data Rate (SDR) or Double Data Rate (DDR) Dynamic Random Access Memory (DRAM) devices. Alternatively, however, the memory devices may comprise other kinds of RAM such as Static RAM (SRAM) or Fast-Cycle RAM (FCRAM), programmable devices such as Read-Only Memory (ROM), Programmable ROM (PROM) or Electrically Programmable ROM (EPROM), analog memory devices such as NAND or NOR Flash memories, or any other suitable type of memory device.

Memory controller 24 accepts input data for storage from one or more data sources. In the present example, the memory controller comprises a multi-port controller, which accepts input data from multiple bus masters 32. Each bus master 32 is connected to a respective port 40 of memory controller 24 using a respective host bus 36.

In the embodiment of FIG. 1, each host bus comprises a 32-bit bus, although any other suitable bus width (for example 64-bit bus width) can also be used. Typically, each bus master 32 provides input data to memory controller 24 in predefined blocks. In the present example, each block of input data comprises sixty-four bytes of data (which is a typical 16-beat burst on a 32-bit bus), although any other suitable block size can also be used.

Memory controller 24 comprises an error correction unit 44, which encodes the input data with a suitable Error Correction Code (ECC) in order to increase the data storage reliability. In the present example, unit 44 encodes the input data with a Hamming code, which encodes every eight bytes of input data to produce a respective byte of ECC redundancy. Alternatively, any other suitable code type and code rate can also be used. Typically although not necessarily, unit 44 encodes the input data originating from each port 40 separately. In the present embodiment, unit 44 encodes each block of input data separately. With the above-described code, unit 44 encodes each sixty-four byte block of input data to produce seventy-two bytes of encoded data. The encoded data comprises interleaved input data and ECC redundancy information.

Memory controller 24 comprises a storage unit 48, which accepts the encoded data from ECC unit 44, formats the encoded data appropriately and stores it in memory devices 28A . . . 28C. In system 20, memory controller 24 is connected to memory devices 28A . . . 28C using a single data bus 52, whose lines are partitioned among the memory devices. In the present example, data bus 52 has a bus width of twenty-four bits. Each of the three memory devices is programmed using a respective subset of eight lines out of the twenty-four lines of bus 52. By splitting the twenty-four lines of bus 52 into three subsets for programming the three memory devices, memory controller 24 handles a single data bus, while each memory device is effectively accessed using its standard 8-bit data bus interface.

Typically, each of memory devices 28A ... 28C comprises a DRAM device that is designed to accept data for storage in bursts. Each burst comprises M bytes that are written to the memory device in M consecutive clock cycles. In the present example, each burst comprises eight bytes, although other burst sizes (e.g., four bytes per burst) can also be used. As will be shown below, memory controller 24 programs the memory devices while preserving the burst structure they are designed to support.

The system configuration of FIG. 1 is an example configuration, which is chosen purely for the sake of conceptual clarity. In alternative embodiments, any other suitable configuration can also be used. For example, system 20 may comprise any other suitable number of memory devices. Typically, although not necessarily, the number of memory devices is not an integer power of two. As such, the bus width of data bus 52 in these configurations is also not an integer power of two. For example, bus widths that are multiples of three can be used.

The elements of memory controller 24, including units 44 and 48, may be implemented using hardware circuitry, using software running on a suitable processor, or using a combination of hardware and software elements. In some embodiment, memory controller comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Efficient Inband Storage of Error Correction Information

In some embodiments, memory controller 24 stores the encoded data in memory devices 28A ... 28C efficiently by formatting the encoded data in a super-frame structure, and storing the super-frame in the memory devices.

Figure 2:
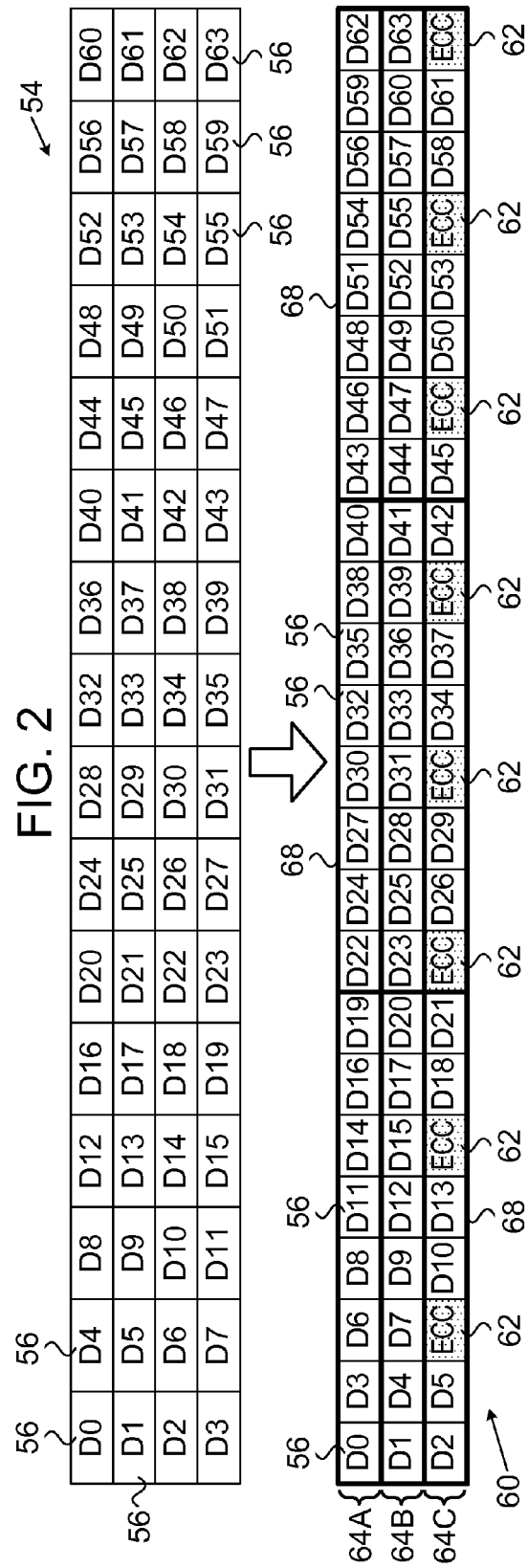
FIG. 2 is a diagram that schematically illustrates a process of constructing a super-frame of interleaved data and error correction information, in accordance with an embodiment of the present invention.

FIG. 2 is a diagram that schematically illustrates a process of constructing a super-frame, in accordance with an embodiment of the present invention. The top of the figure shows a block 54 of input data, which is provided to memory controller 24 by one of bus masters 32 via the respective port 40. In the present example, the block of input data comprises sixty-four data bytes 56 denoted D0 ... D63, which are provided over sixteen bus cycles of host bus 36.

As explained above, ECC unit 44 of memory controller 24 encodes the sixty-four data bytes 56, so as to produce seventy-two bytes of encoded data. The encoded data comprises the original sixty-four data bytes 56, plus eight redundancy bytes (also referred to as ECC bytes) 62. Storage unit 48 in the memory controller stores the seventy-two bytes of encoded data in memory devices 28A ... 28C.

In order to store the encoded data efficiently, unit 48 formats the encoded data in a super-frame 60. Super-frame 60 consists of three burst sequences 64A ... 64C, which are arranged in parallel to one another. Burst sequences 64A ... 64C are to be stored in memory devices 28A ... 28C, respectively. Each burst sequence consists of three bursts 68. Each burst 68 comprises eight bytes, which may comprise data bytes 56 and/or ECC bytes 62. (The eight-byte bursts are marked with thick border lines in the figure. The ECC bytes in the super-frame are marked with a dotted pattern in the figure.) For example, the first burst in sequence 64A comprises data bytes D0, D3, D6, D8, D11, D14, D16 and D19. As another example, the second burst in sequence 64C comprises an ECC byte, data bytes D26 and D29, another ECC byte, data bytes D34 and D37, yet another ECC byte and finally data byte D42.

As can be seen in the figure, the data and ECC redundancy are interleaved with one another in the super-frame. Moreover, the super-frame is fully-populated with data, and therefore utilizes data bus 52 efficiently without wasting write cycles. In addition, this structure retains byte alignment for each eight-byte block. For example, data bytes D0, D8, D16, ... belong to the same burst sequence, and therefore sent on the same subset of lines of bus 52 to the same memory device.

Memory controller 24 stores the encoded data, which is formatted in super-frame 60, in the memory devices over data bus 52. In the storage process, unit 48 of the memory controller writes burst sequence 64A to memory device 28A, concurrently with writing burst sequence 64B to memory device 28B, and concurrently with writing burst sequence 64C to memory device 28C. Memory controller 24 writes 24-bit words to data bus 52. Each 24-bit data word comprises three bytes that are written respectively to the three memory devices in parallel. Thus, the entire super-frame is stored using three burst durations. Each memory device is programmed with three 8-byte bursts according to its standard interface.

In the example of FIG. 2, the dimensions of the super-frame and the ECC code rate are selected so that the encoded data resulting from a given block of input data produces a fully-populated super-frame. As such, the storage process carried out by system 20 is highly efficient in terms of bus cycles on data bus 52. In alternative embodiments, other suitable system parameters (e.g., the number of memory devices—and consequently the number of burst sequences in the super-frame, the number of bursts per burst sequence, and the ECC code rate) can be chosen.

Figure 3:
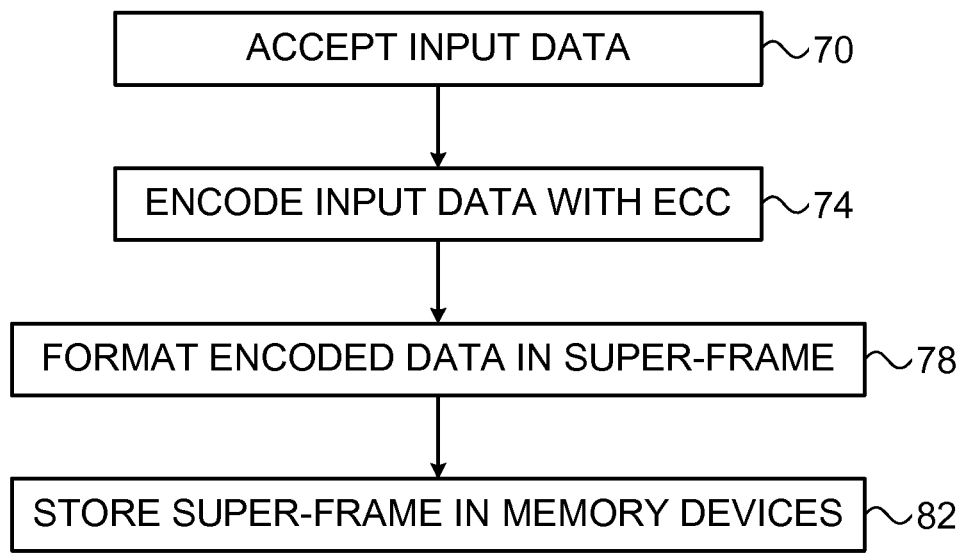
FIG. 3 is a flow chart that schematically illustrates a method for data storage, in accordance with an embodiment of the present invention.

FIG. 3 is a flow chart that schematically illustrates a method for data storage, in accordance with an embodiment of the present invention. The method begins with memory controller 24 accepting a block of input data, at an input step 70. ECC unit 44 in the memory controller encodes the input data with an ECC so as to produce encoded data, at an encoding step 74. Storage unit 48 in the memory controller formats the encoded data in a super-frame of interleaved data and ECC redundancy information, at a formatting step 78. Unit 48 stores the super-frame in the memory devices, at a storage step 82.

The description above refers mainly to data storage. Data readout is typically performed in a similar manner, using super-frames whose size is selected to match the burst size over host bus 36. The memory controller typically reads the super-frame and decodes the ECC, so as to reconstruct the input data that was stored in the memory devices. For example, in system 20 of FIG. 1 above, the memory controller may read data from memory devices 28A ... 28C using super frames that match a burst size of sixteen beats over a 32-bit bus width (i.e., a total of sixty-four bytes per burst).

In some embodiments, the memory controller writes and/or reads only part of a super-frame in a given write or read operation. In some embodiments, the memory controller modifies data (e.g., a single byte) that is stored in the memory devices by performing a read-modify-write process. In such a process, the memory controller modifies the data by reading an entire super-frame (or part of a super-frame) that contains this data, modifying the data as desired, recalculating the ECC, and storing the modified super-frame (or part thereof).

This sort of process is useful, for example, when a bus master 32 instructs the memory controller to update a limited amount of data, e.g., a single byte.

Although the embodiments described herein mainly address memory devices and memory controllers, the methods and systems described herein can also be used in other applications, such as in generic bus interfaces and interconnects between Central Processing Units (CPUs), peripherals and other devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
   encoding input data with an Error Correction Code (ECC), to produce encoded data;
   formatting the encoded data in a super-frame consisting of a given number of burst sequences arranged in parallel, each burst sequence consisting of one or more bursts of multiple bytes of the encoded data; and
   storing, in parallel, the burst sequences of the super-frame in respective memory devices over a single data bus having a bus width, in bytes, that is equal to the given number.

2. The method according to claim 1, wherein the given number is not an integer power of two.

3. The method according to claim 1, wherein the given number is three, and the bus width is three bytes.

4. The method according to claim 1, wherein the encoded data comprises data bits and redundancy bits, and wherein formatting the encoded data comprises interleaving the data bits and the redundancy bits in the super-frame.

5. The method according to claim 1, wherein formatting the encoded data comprises filling all the bytes in the super-frame with the encoded data.

6. The method according to claim 1, wherein the memory devices comprise Dynamic Random Access Memory (DRAM) devices.

7. The method according to claim 1, and comprising accepting the input data in blocks, wherein formatting the encoded data comprises translating each block of the input data into a respective super-frame.

8. The method according to claim 1, wherein storing the burst sequences over the single data bus comprises assigning respective different portions of the bus width to the memory devices, and storing the burst sequences in the respective memory devices over the respective portions of the bus width.

9. The method according to claim 1, and comprising, after storing the burst sequences, retrieving the input data by reading the super-frame from the memory devices and decoding the ECC that encodes the read super-frame.

10. The method according to claim 1, and comprising, after storing the burst sequences, modifying a portion of the super-frame by reading at least part of the super-frame containing the portion from the memory devices, modifying the portion in the read at least part of the super-frame, re-encoding the read at least part of the super-frame, and storing the re-encoded at least part of the super-frame in the memory devices.

11. A memory controller, comprising:
   an error correction unit, which is configured to encode input data with an Error Correction Code (ECC) so as to produce encoded data; and
   a storage unit, which is configured to format the encoded data in a super-frame consisting of a given number of burst sequences arranged in parallel, each burst sequence consisting of one or more bursts of multiple bytes of the encoded data, and to store, in parallel, the burst sequences in respective memory devices over a single data bus having a bus width, In bytes, that is equal to the given number.

12. The memory controller according to claim 11, wherein the given number is not an integer power of two.

13. The memory controller according to claim 11, wherein the given number is three, and the bus width is three bytes.

14. The memory controller according to claim 11, wherein the encoded data comprises data bits and redundancy bits, and wherein the storage unit is configured to interleave the data bits and the redundancy bits in the super-frame.

15. The memory controller according to claim 11, wherein the storage unit is configured to fill all the bytes in the super-frame with the encoded data.

16. The memory controller according to claim 11, wherein the memory devices comprise Dynamic Random Access Memory (DRAM) devices.

17. The memory controller according to claim 11, and comprising at least one port that is configured to accept the input data in blocks, wherein the storage unit is configured to translate each block of the input data into a respective super-frame.

18. The memory controller according to claim 11, wherein the memory devices are assigned respective different portions of the bus width, and wherein the storage unit is configured to store the burst sequences in the respective memory devices over the respective portions of the bus width.

19. The memory controller according to claim 11, wherein the storage unit is configured to read the super-frame from the memory devices after storing the burst sequences, and wherein the error correction unit is configured to decode the ECC that encodes the read super-frame, so as to retrieve the input data.

20. The memory controller according to claim 11, wherein the storage unit is configured to modify a portion of the super-frame after storing the burst sequence, by reading at least part of the super-frame containing the portion from the memory devices, modify the portion in the read at least part of the super-frame, and, after re-encoding the modified at least part of the super-frame by the error correction unit, storing the modified at least part of the super-frame in the memory devices.

21. A memory system, comprising:
   a given number of memory devices;
   a data bus having a bus width, in bytes, that is equal to the given number; and
   a memory controller, which is configured to encode input data with an Error Correction Code (ECC) so as to produce encoded data, to format the encoded data in a super-frame consisting of the given number of burst sequences arranged in parallel, each burst sequence consisting of one or more bursts of multiple bytes, and to store, in parallel, the burst sequences in the respective memory devices over the data bus.

* * * * *